United States Patent
Sigg et al.

(10) Patent No.: US 7,937,831 B2
(45) Date of Patent: May 10, 2011

(54) METHOD FOR CONNECTING AN ELECTRIC ACTUATOR TO A PRINTED CIRCUIT BOARD

(75) Inventors: Daniel Sigg, Sonceboz (CH); Corinne Zuppiger-Lachat, Bienne (CH)

(73) Assignee: Sonceboz SA, Sonceboz (CH)

( * ) Notice: Subject to any disclaimer, the term of this patent is extended or adjusted under 35 U.S.C. 154(b) by 507 days.

(21) Appl. No.: 11/913,680

(22) PCT Filed: May 11, 2006

(86) PCT No.: PCT/IB2006/002272
§ 371 (c)(1),
(2), (4) Date: Apr. 15, 2008

(87) PCT Pub. No.: WO2006/136957
PCT Pub. Date: Dec. 28, 2006

(65) Prior Publication Data
US 2009/0042416 A1     Feb. 12, 2009

(30) Foreign Application Priority Data
May 11, 2005  (FR) ...................... 05 51217

(51) Int. Cl.
H01R 9/00 (2006.01)
H01R 12/00 (2006.01)
(52) U.S. Cl. ................ 29/845; 29/831; 29/832; 29/852; 29/874; 29/561; 439/78
(58) Field of Classification Search ............ 29/845, 29/852, 830, 831, 832, 874, 561; 257/738, 257/780; 439/78, 66, 83; 228/169, 165, 174, 187
See application file for complete search history.

(56) References Cited

U.S. PATENT DOCUMENTS

| | | | |
|---|---|---|---|
| 3,670,409 A | | 6/1972 | Reimer |
| 4,107,836 A | * | 8/1978 | Roberts ........................ 29/847 |
| 4,806,111 A | * | 2/1989 | Nishi et al. .................... 439/109 |
| 6,704,994 B1 | * | 3/2004 | Gijs ............................... 29/601 |
| 6,938,338 B2 | * | 9/2005 | Fjelstad et al. ................ 29/874 |

FOREIGN PATENT DOCUMENTS

| | | |
|---|---|---|
| DE | 197 35 409 | 3/1999 |
| DE | 19735409 A1 * | 3/1999 |
| JP | 10-032280 * | 3/1998 |
| WO | 2005 032224 | 4/2005 |

* cited by examiner

*Primary Examiner* — Derris H Banks
*Assistant Examiner* — Tai Nguyen
(74) *Attorney, Agent, or Firm* — Oblon, Spivak, McClelland, Maier & Neustadt, L.L.P.

(57) ABSTRACT

A method of connecting an electric actuator to a printed circuit by metal contacts having an open contact zone. The metal contacts are soldered to the printed circuit using an SMD-type automated method performed at a high speed and at a high temperature, and the electrical connection pins of the actuator can be mechanically connected to the metal contacts without soldering by butting the contact zone of the metal contacts against the connection pins of the actuator once the connection pins have been inserted through the contact zone.

12 Claims, 7 Drawing Sheets

METHOD FOR CONNECTING AN ELECTRIC ACTUATOR TO A PRINTED CIRCUIT BOARD

BACKGROUND OF THE INVENTION

I. Field of the Invention

The present invention relates to a method for solderless connection of an electric actuator to a printed circuit, mainly for applications on motor vehicle dashboards.

II. Description of Related Art

The traditional methods of soldering electronic components onto printed circuits, whether through-hole mounted or surface mounted devices (SMD), are already known in the prior art. For example, the so-called wave method allows soldering of through-hole mounted components placed on the printed circuit by means of a wave of tin and lead which comes into contact with the printed circuit, and thus to solder the components. Another example is the so-called reflow method, which consists of passing the printed circuit, on which the components are pre-positioned with a mix of tin and lead (soldering paste), through a series of furnaces with different temperature levels. This method is currently the most widespread for soldering SMD components and has a number of advantages over the wave method, since it allows more efficient soldering and is less traumatic for all the components (it avoids bridges and shadow zones).

However, changes in environmental standards are rendering these techniques obsolete and dangerous for the environment, since they still require the use of lead, which reduces the melting temperature in tin-based soldering pastes (typically to 180° C.). Lead-free solutions have therefore been developed in compliance with new directives such as, for example, the RoHS directive (Restriction of Hazardous Substances), which bans any substance that is harmful for the environment, in particular lead, from soldering pastes.

The new soldering pastes used, almost entirely made from tin, therefore have the disadvantage of requiring higher melting temperatures (around 220-230° C.), which can damage the electric actuators and/or certain fragile components mounted on the printed circuit.

It is therefore necessary to develop new connector technology solutions.

Solutions exist already in the prior art that resolve these problems by the insertion of female connectors, called tulip connectors, which are soldered on their own on the printed circuit before the actuator is positioned and which are designed to connect and support the actuator. The actuator then has male connection pins, which allow the actuator to be electrically connected by insertion in the tulip connectors without any trauma for the actuator. These solutions have the disadvantage of being expensive and of often comprising a thermoplastic element designed to support the tulip connectors. In addition, while the electrical connection is guaranteed, the mechanical support is far from perfect, which can be detrimental to applications such as the micromotors used on motor vehicle dashboards. In fact, the printed circuit+actuator assembly is subjected to potentially considerable vibrations and there is a real need for good mechanical support. For this reason, it is traditionally necessary to add a part that will mechanically support the actuator on the circuit, for example a flange. This increases the production cost and adds an extra step to the assembly of the actuator.

Another connection mode called press-fitting also exists, which does not require soldering and allows electrical connection by mechanical deformation of a connector in a drill hole of the printed circuit.

The actuator can therefore be connected without soldering to the connector. This solution is practical since it does away with the need to solder the components, but is also has certain disadvantage: the force of insertion on the printed circuit is considerable, which can damage said circuit, and the connectors and the drill holes on the printed circuit must have accurate manufacturing tolerances in order to ensure sufficient mechanical support.

The state of the art includes, in particular, international patent application WO2005/032224 in which the metal plug to be fixed has a diameter greater than that of the receiving hole made in the printed circuit. For this reason, the insertion is carried out by mechanical retention in the printed circuit. The connection stress is high, creating constraints that are detrimental to the printed circuit. This solution also provides for soldering after positioning the element to be connected.

U.S. Pat. No. 3,670,409 presents another solution in which conductive sheets are fixed to a printed circuit by means of an adhesive.

BRIEF SUMMARY OF THE INVENTION

The present invention provides a solution to these problems and proposes, for this purpose, an industrial method for connecting the actuator to the printed circuit on a large scale, inexpensively, in an automated fashion and at a high speed, not requiring soldering of the actuator and guaranteeing good mechanical support of the actuator on the printed circuit. In a first step, the method consists of a simple, inexpensive SMD-type transfer of a specific metal contact, especially developed for implementing the invention. These metal contacts have an open contact zone which can be made by stamping, shearing or any other equivalent method. They can be delivered in various formats according to the current state of the art, for example the following methods can be cited: individually in bulk, in strips adapted to the placement machines, in "tape & reel" where each contacts is placed individually in a plastic support, etc. These contacts are, in a preferable but non-limiting manner, made from steel and have a thickness of typically around 0.1 mm. They generally have a coating that makes them easier to solder on the printed circuit. The mix that allows the soldering of the contact is previously deposited at the location of the contact on the circuit. Once the contacts are deposited, the circuit is placed in a furnace with a defined variable temperature profile. The electrical contacts and the other components are therefore soldered during this operation.

In a second stage, once the printed circuit is soldered with all the SMD components (metal contacts, LEDs, monitoring electronics, etc.), the actuator can be connected to the circuit, without soldering and with no temperature-related trauma and without requiring any considerable insertion force.

The connection is performed by inserting electric connection pins, connected to the actuator, in the metal contacts specially placed on the printed circuit, and which have an opening, preferable cross-shaped, which the connection pins of the actuator pass through.

This shape, which is not limiting, can be made by stamping, which is to say by lifting the material, or by shearing, in which case it is cut with no loss of material. It is also possible to choose the way this is performed according to possible production imperatives. Another shape can also be considered: circular or, more generally, a star shape with several branches.

This specific shape makes it possible to crimp the connection pins and guarantee the electrical contact. Grooves present on the connection pins make it possible, in addition, to maintain the connection rigid. However, these grooves are not essential, since the connection of the tabs is guaranteed by the physical contact between the two elements.

These connection pins are similar to the electrical connection pins commonly used on actuators and soldered like any through-hole component. In fact, one of the aims of the present invention is to provide an actuator with electrical connection pins which can be, as preferred, soldered using traditional methods for soldering through-hole mounted components, or by the method proposed in the present document, without requiring two different types of pins.

In a preferred embodiment of the invention, the printed circuit had pads, which is to say tinned zones, with a substantially square shape. They are designed to receive the substantially square metal contacts, with a side length preferably comprised between 0.8 times and 1 time the side length of said pad. This shape and geometric ratio guarantee self-centering of the metal contact on the pad during the soldering step. This results in the positioning of the metal contacts being completely precise and guarantees an optimal orientation of the opening in relation to the connection pin.

It is evidently possible to provide a round pad shape which can be associated with a round connection pin.

In a preferred but non-limiting embodiment of the invention, the metal contact has a cross-shaped opening, and the connection pin has a square shape. The placement of the motor on the printed circuit therefore guarantees a secure electric connection without the need for indexing, and self-centering of the connection pin in the metal contact.

In a preferred embodiment, the printed circuit has openings of the through-hole mounted cylindrical type which allow the connection pins through and allow the cross shape of the metal contact to deform freely when connecting the connection pin to the metal contact.

Another objective of the invention is to provide a method that can be used for front assembly of the motor, which is to say with the motor placed on the top surface of the printed circuit on the side of the electronic components, or rear assembly, which is to say with the motor placed on the bottom side of the printed circuit opposite the components.

In this way, it can be provided to pre-fold the metal contact at the level of the opening on one side or the other of the printed circuit in order to facilitate the insertion of the connection pins. It is also possible not to pre-fold the opening zone of the contact in order to make a unique printed circuit+ metal contact assembly which can be used for the two existing assembly versions.

In the event of being in rear assembly configuration, the deformation of the open zone takes place opposite the drill hole of the printed circuit. In this case, it is possible to make a drill hole with a smaller diameter in order to guarantee an optimum soldering surface for the metal contact on the printed circuit.

In the event of being in front assembly, the drill hole diameter of the printed circuit must at least be larger than the diameter in which the fold of the open zone is made.

BRIEF DESCRIPTION OF THE DRAWINGS

This description will be understood better by referring to the appended drawings, in which.

DETAILED DESCRIPTION OF THE INVENTION

Figure 1A:
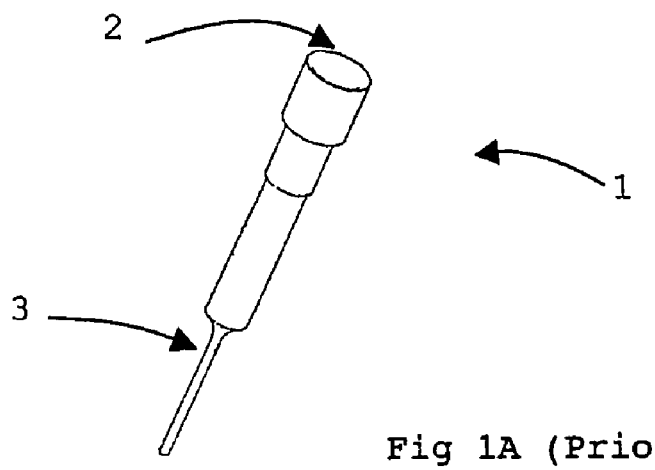
FIG. 1A shows a view of a tulip-type electric connector of the prior art.

FIG. 1A shows a tulip connector (1), extensively used for years in the field of electronic connections. This element is designed to receive, on its top part (2), an electrical connection pin, for example belonging to an electric actuator. The bottom end (3) of this tulip connector (1) is formed so as to pass through a drill hole made on a printed circuit (not shown), and designed to then be soldered to said printed circuit. This type of connector, while it allows good electrical contact inside the tulip connector (1), does not however make it possible to guarantee sufficient mechanical support for sensitive applications in which there are many vibrations of considerable amplitude, such as for example actuators designed for motor vehicle dashboards.

Figure 1B:
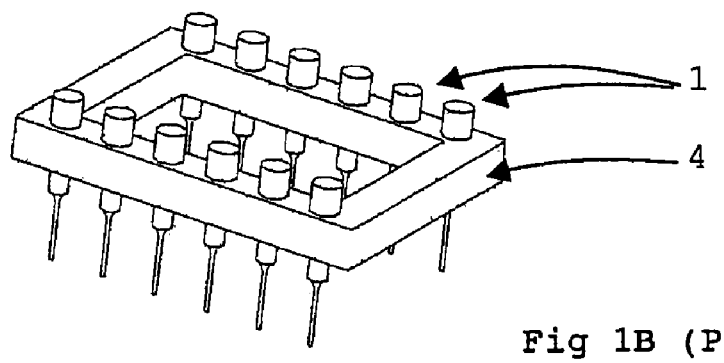
FIG. 1B shows a view of a thermoplastic connector on which are arranged various tulip-type electric connectors of the prior art.

This tulip connector (1) can also be integrated in a support grouping together several connectors of the same type, which allows all the tulip connectors of an application to be installed in a single operation. An example of such a support is shown in FIG. 1B which shows twelve tulip connectors (1) placed in a support (4). This support (4) is designed to then be placed on a printed circuit (not shown) to which each tulip connector (1) will then be soldered. This type of support has been known for years, but is an additional part, generally thermoplastic, which implies an additional cost and requires installation on the printed circuit.

Figure 2:
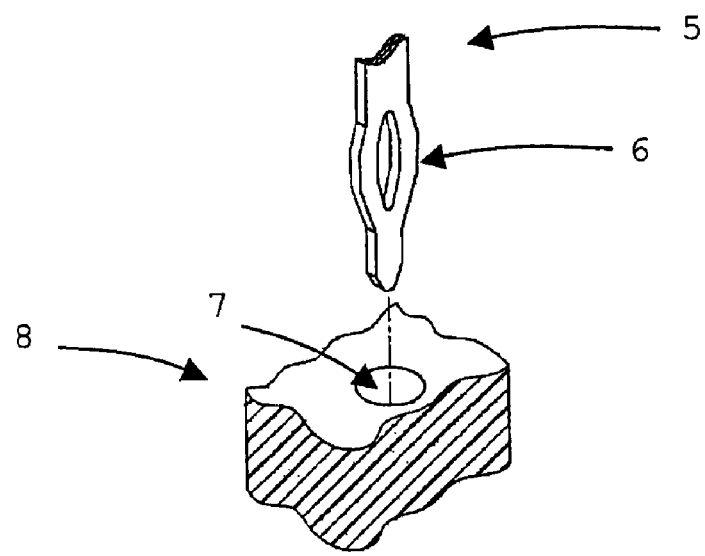
FIG. 2 shows a so-called press-fit connection of the prior art.

FIG. 2 shows a press-fit connector (5) of the prior art. This connector (5) consists of a deformable central part (6), generally made up of a drill hole and two separated external parts. When the connector (5) is inserted in the drill hole (7) of the support (8), which can be a printed circuit, the deformable central part (6) deforms under the pressure exerted on the support (8) and then creates an electrical connection and a mechanical support of the connector (5) by reaction and friction between the inside of the drill hole (7) and the deformable central part (6). The disadvantages of this type of connection include the considerable effort required to insert the connector (5) in the support (8), which can damage said support (8), and the precision of the mechanical tolerances, which are essential for the quality of the connection.

Figure 3:
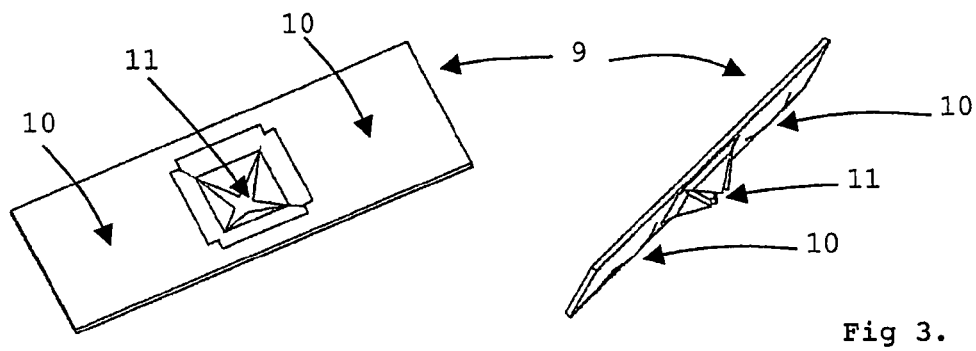
FIG. 3 shows two metal contacts, in a first embodiment, used in the present method.

FIG. 3 shows two metal contacts (9) used in the new method presented in this application. They are preferably made from steel and have a thickness of around 0.1 mm, which is a non-limiting value. This metal contact (9), designed to be soldered on a printed circuit has, for example, two convex zones for attachment (10) to the printed circuit, which form the zones for soldering to the printed circuit. This particular shape is an example of what is possible, but is not limiting. The metal contact (9) has a second zone, which is an electrical contact zone (11) between the printed circuit and the element to be powered, for example an electric actuator. This electrical contact zone (11) is shown here with a cross shape, which is not a limiting embodiment. The electrical contact zone (11) must be open or be capable of opening when an external electrical connection element passes through it.

Figure 4:
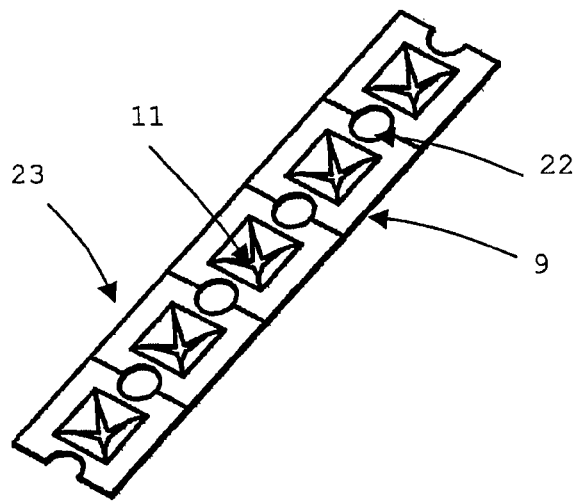
FIG. 4 shows an assembly of metal contacts, in a second embodiment, presented in a strip.
Figure 6:
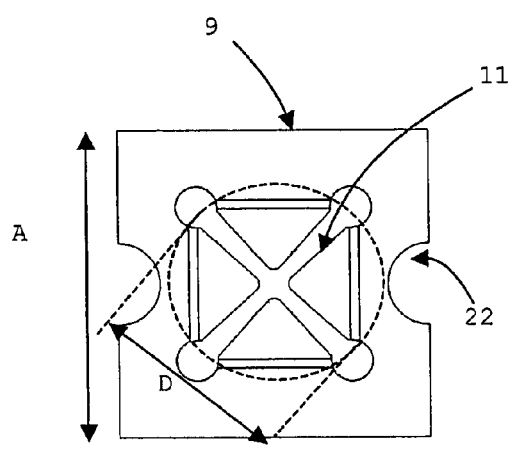
FIG. 6 shows a metal contact described by the present invention in a first embodiment of the opening by stamping.
Figure 7:
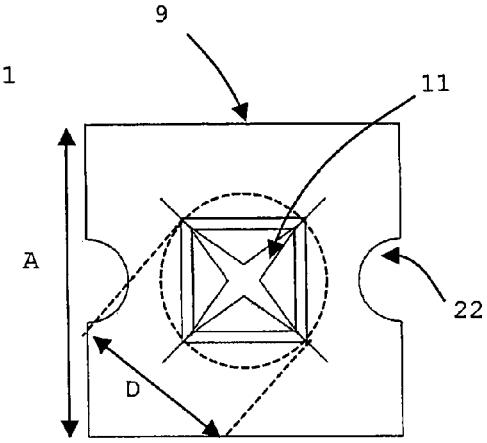
FIG. 7 shows a metal contact described by the present invention in a second embodiment of the opening by shearing.

FIG. 4 shows the metal contacts (9) in a strip (23) in a first embodiment of the invention and prior to use. They advantageously comprise, in a non-limiting manner, a cutting zone (22) which allows the cutting tool to handle the strip (23) and move it forward. The electrical contact zone (11) is visible. It can be made by stamping, as shown in FIG. 6, which is to say that the material is lifted in order to form the contact zone (11). It can also be made by shearing, as shown in FIG. 7, which is to say by cutting the material with no loss. The choice of one method or the other will depend on the production imperatives.

Figure 5:
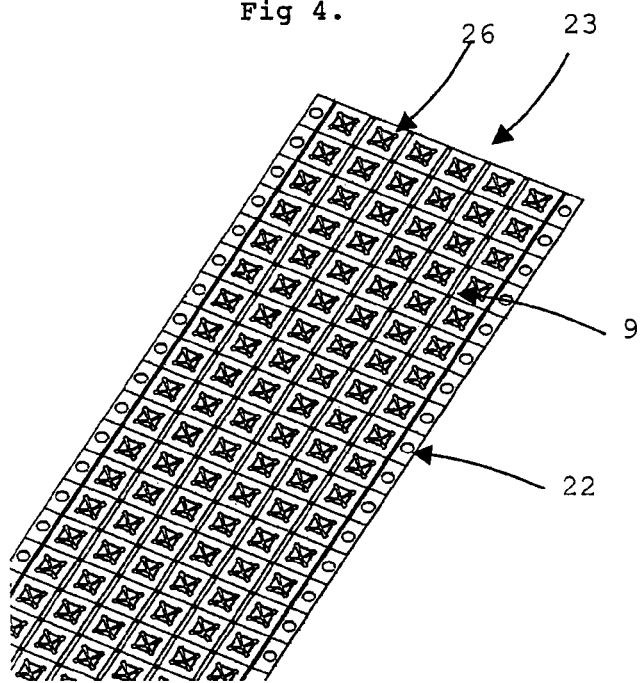
FIG. 5 shows an assembly of metal contacts, in a second embodiment, presented in several strips.

FIG. 5 shows the metal contacts (9) in a strip (23) in a second embodiment of the invention and prior to use. In this embodiment, in which several rows (26) are positioned next to one another, it is possible to create cutting zones (22) which can be used by the cutting tool to handle the strip (23) and move it forwards.

In a preferred embodiment, the metal contact (9) has a substantially square shape, with the side length marked A.

In both cases, the opening zone defines a diameter D in which the contact zone is capable of folding.

Figure 8:
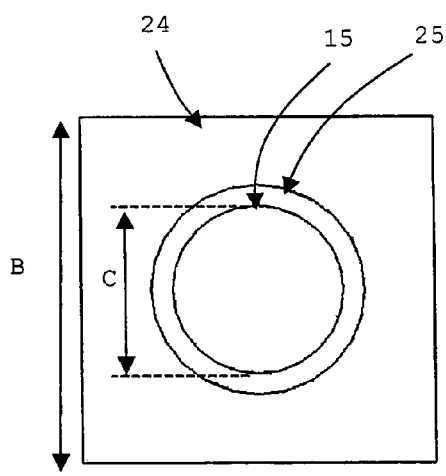
FIG. 8 shows a view of a tinned pad or surface made on a printed circuit for which the metal contact of the present method is designed.
Figure 9:
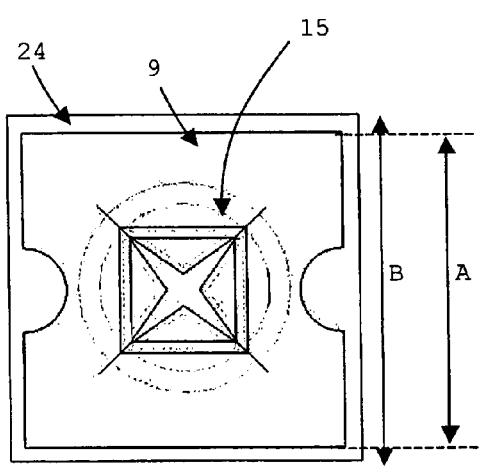
FIG. 9 shows a metal contact placed on the pad of the printed circuit prior to the insertion of a connection pin.

This metal contact (9) is designed to be placed on a tinned pad or zone (24) of the printed circuit (13), as shown in FIG. 8, which advantageously has a substantially square shape in which the side length is marked as B. When soldering the metal contact using a SMD-type method (by reflow, for example) and in order to guarantee self-centering of the metal contact (9) on the pad (24), as shown in FIG. 9, the side length A must advantageously be comprised between 0.8 times and 1 time the side length B.

The tinned square shape of the pad (24) is generally delimited by a diameter (25), the inside of which is not tinned. The drilled through hole (15) made on the printed circuit (13) serving to allow an electrical connection pin (17) through it is made with a diameter C that is less than the inner diameter of the tinned zone (25).

Figure 10:
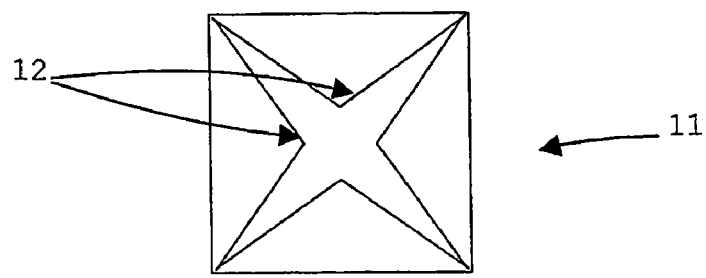
FIG. 10 shows an enlarged view of a metal contact used in the present method.

FIG. 10 shows an enlargement of the cross-shaped electrical contact zone (11). When the electrical connection pins (17) pass through it, the electrical contact is created, defined in this case by four point-shaped contact points (12); neither the number nor the shape of the contact points (12) being limiting. In a preferred manner, the cutting of the electrical contact zone (11) is carried out in such a way that the contact points (12) are curved towards the printed circuit (13), so as to facilitate the insertion of the electrical connection pins (17).

Figure 11:
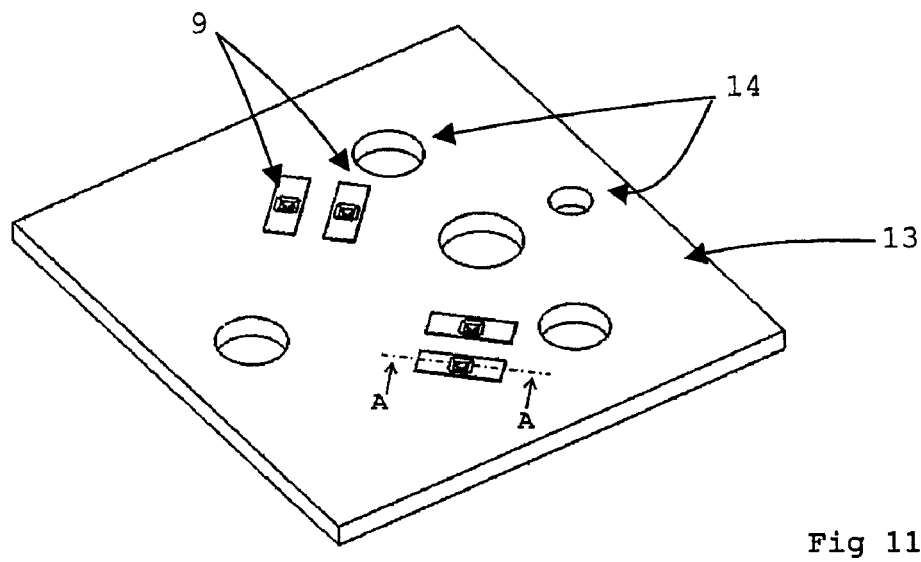
FIG. 11 shows a view of the metal contacts used in the present method soldered on a printed circuit.

Before this insertion, the metal contacts (9), once made, are then pre-positioned on a printed circuit (13) as shown in FIG. 11. The relative position of each metal contact (9) depends on the geometrical characteristics of the actuator to be connected.

In this example, the actuator to be connected contains two independent power supply coils, which therefore corresponds to four distinct connections. The printed circuit (13) also has drill holes (14) of different sizes, designed for positioning the electric actuator in relation to the metal contacts (9) and thus for facilitating the connection.

Figure 12:
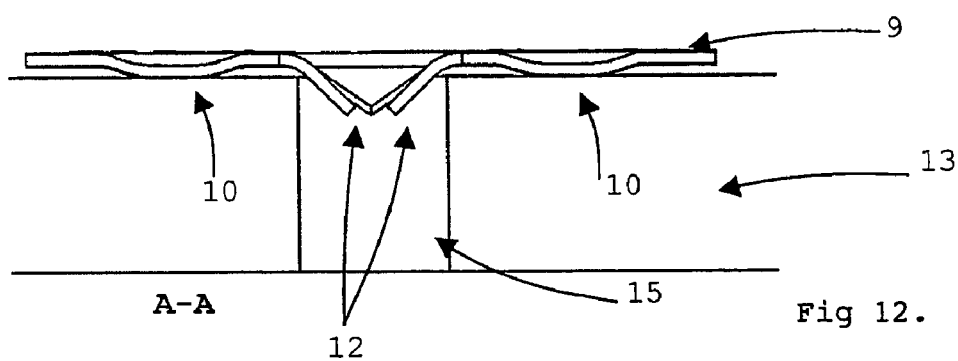
FIG. 12 shows a section view of a printed circuit on which is placed a metal contact used by the present invention, with the open zone deformed towards the printed circuit.

FIG. 12, which is a section view of the printed circuit (13) along line A-A in FIG. 11, specifies the positioning of the metal contact (9) on said printed circuit (13). Attachment zones (10) in contact with the printed circuit (13) are found at the point where the soldering is made, for example, by means of a reflow method. For this purpose, a soldering paste must be previously placed at the point of contact of the attachment zones (10) on the printed circuit (13). These two attachment zones (10) guarantee the support of the metal contacts (9) on the printed circuit (13) and allow the electrical contact zone (11) to be positioned inside a drill hole (15) previously made in the printed circuit (13). The four contact points (12) can then freely and easily deform when connecting the actuator.

Figure 13:
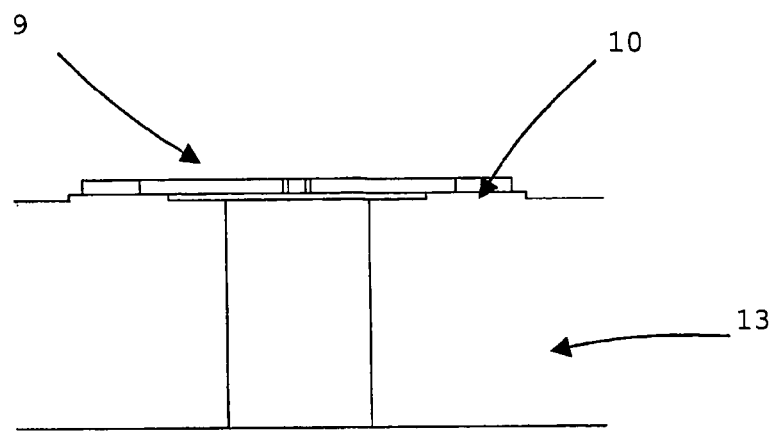
FIG. 13 shows a section view of a printed circuit on which is placed a metal contact used by the present invention, with the open zone not deformed.

In FIG. 13, the metal contact is pre-positioned on the printed circuit (13) as in figure (12). This metal contact (9), according to a second embodiment, has a square shape and does not have specific attachment zones. The entire surface of the contact (9) represents this attachment zone (10). In this configuration, the electrical contact zone (11) is not pre-shaped in order to be able to receive a connection pin (17) of an actuator (16), in rear or front assembly. In this way, there is only one printed circuit+contact assembly, which can be used for the two possible types of assembly.

Figure 14:
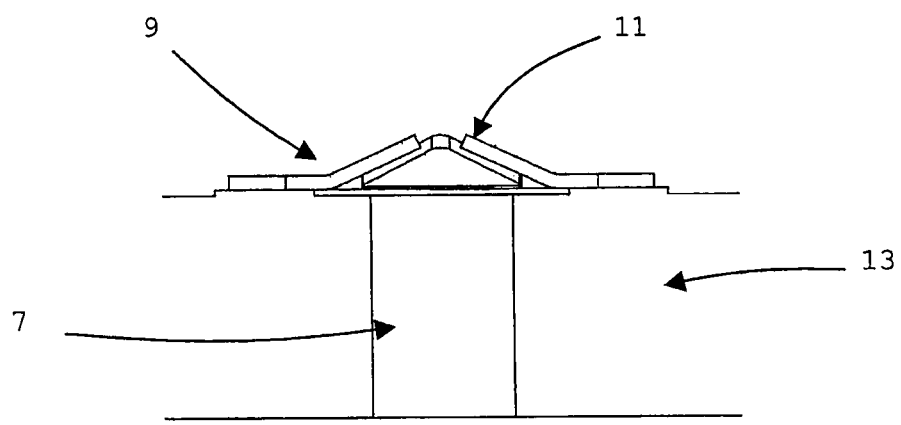
FIG. 14 shows a section view of a printed circuit on which is placed a metal contact used by the present invention, with the open zone deformed away from the printed circuit.

In FIG. 14, the contact (9) has an electrical contact zone (11) deformed away from the printed circuit in order to receive an electrical connection pin (17) of an actuator (16) mounted in rear assembly. In this configuration, it is possible to make a drill hole (7) with a smaller diameter in order to optimise the soldering surface of the metal contact (9) on the printed circuit (13)

Figure 15:
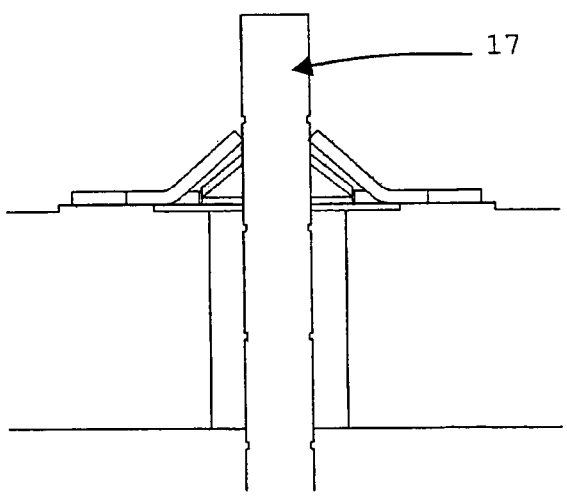
FIG. 15 shows a section view of a printed circuit on which is placed a contact in which is connected an electrical connection pin of an actuator in rear assembly.

FIG. 15 shows the connection pin (17) of an actuator (16) placed in rear assembly. The electrical contact zone (11) deforms when the pin (17) is inserted, and the electrical connection is guaranteed by contact.

Figure 16:
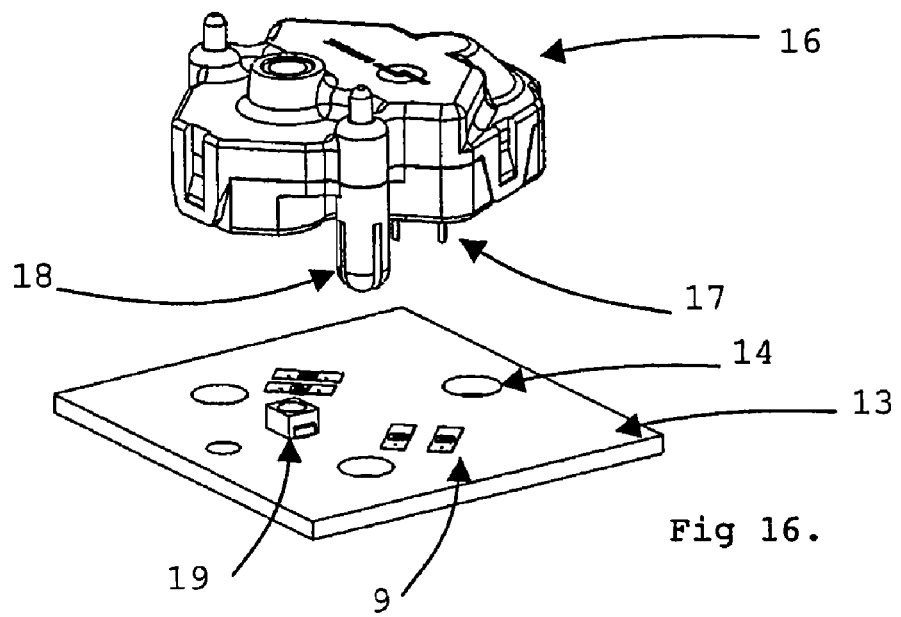
FIG. 16 shows an electric actuator ready to be connected to a printed circuit by means of the present method.

In FIG. 16, an actuator (16) is shown moving towards the printed circuit (13). This actuator (16) can, for example, be such as described in French patent application FR2859323. It therefore comprises four electrical connection pins (17), two of which are shown, designed to be placed through the electrical contact zone (11) of the metal contact (9). The actuator (16) also has mechanical positioning pins (18) designed to guarantee the positioning and attachment of the actuator (16) on the printed circuit (13) by complementarity with the drill holes (14) made. An LED (19) serving to light a pointer (not shown) controlled by the actuator (16), is also positioned on the printed circuit (13).

Figure 17:
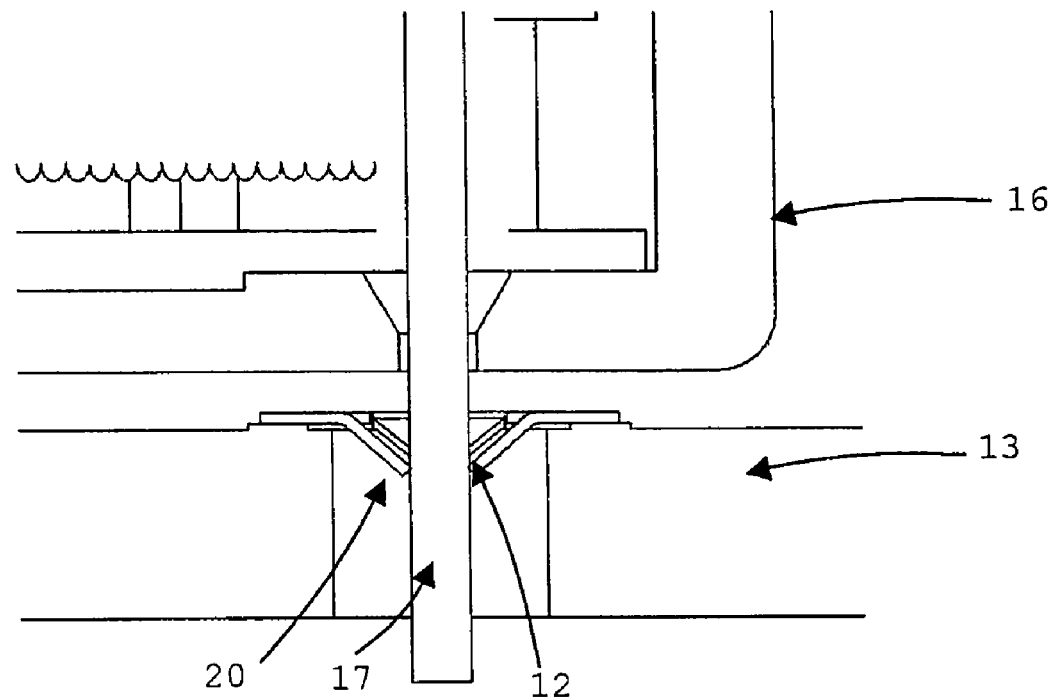
FIG. 17 shows a section view of a printed circuit on which is placed a metal contact used by the present invention and a dashboard actuator connected to the metal contact.
Figure 18:
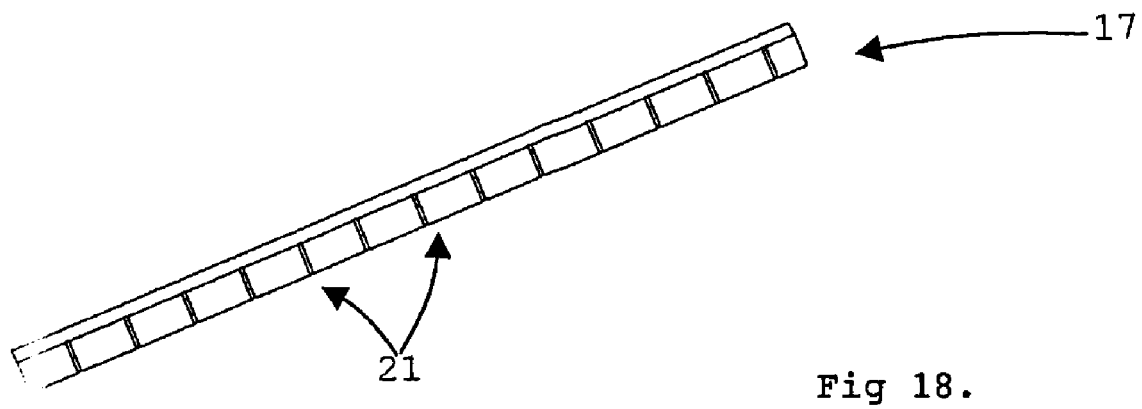
FIG. 18 shows an isolated view of an electrical connection pin of an actuator to be connected according to the present invention.

Once inserted through the electrical contact zones (11), the actuator (16) is positioned fixed on the printed circuit (13). FIG. 17 shows a section view of the actuator (16) on the printed circuit (13). This figure shows the contact zone (20) between one of the electrical connection pins (17) and the point-shaped contact points (12) of the metal contact (9). This connection creates more than just reliable electrical contact between the actuator (16) and the printed circuit (13), it also provides good mechanical support, by crimping of the contact points (12) on the electrical connection pins (17), of which an isolated view is shown in FIG. 18, and butting of the contact points (12) after insertion of the electrical connection pins (17) belonging to the actuator (16). In fact, in a preferred but non-limiting manner, the electrical connection pins (17) have grooves (21) perpendicular to the axis of the electrical connection pin (17). In a preferred manner, the mechanical support is guaranteed by the creation of contact points (12), curved on the side of the printed circuit (13), which limits the reversibility of the movement. The mechanical support obtained is reliable and capable of immobilising the assembly in the case of possible vibrations during the operation of the actuator (16) in the application. The electrical connection pins (17) are similar the connection pins traditionally used for dashboard actuators and can, in this regard, also be soldered to the printed circuit (13) by any soldering method for through-hole mounted components described in the current state of the art.

Figure 19:
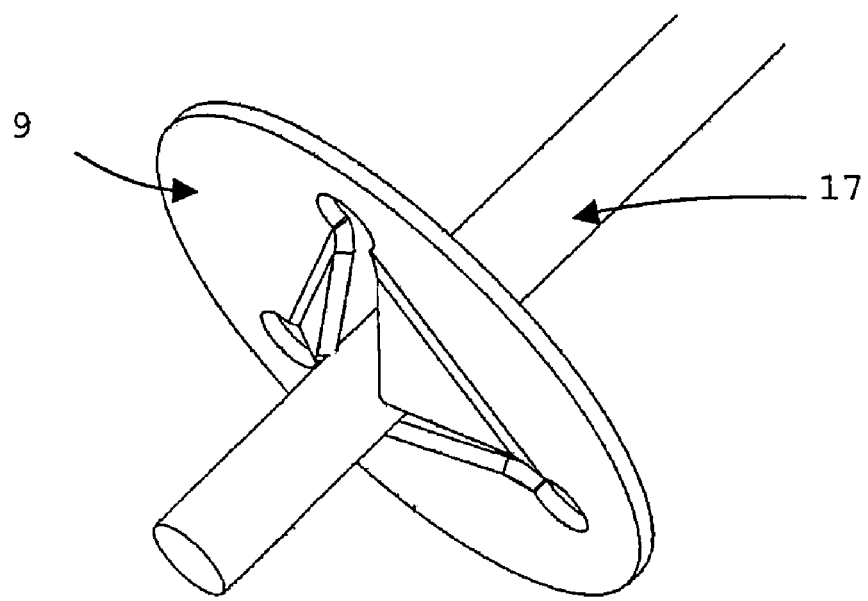
FIG. 19 shows a metal contact in which a connection pin of an actuator is connected, in another embodiment.

FIG. 19 shows an isolated view of a metal contact (9) with one electrical connection pin (17) of an actuator (16) in another embodiment. The metal contact (9) and the connection pin (17) have a substantially circular shape and are designed to be placed on a pad (24), also with a substantially circular shape.

The invention claimed is:

1. A method for connecting an electric actuator to a printed circuit by metal contacts having an open contact zone, the method comprising:
   soldering the metal contacts to the printed circuit using an SMD-type automated method performed at a high speed and at a high temperature,
   wherein electrical connection pins of the actuator can be mechanically connected to the metal contacts without soldering by butting the contact zone of the metal contacts against the connection pins of the actuator once the connection pins have been inserted through the contact zone, said metal contacts including a cross-shaped contact zone and said electrical connection pins having a square shape,
   wherein the printed circuit has substantially square tinned connection pads, and
   wherein the metal contacts have a substantially square shape and are configured to be placed on the pads.

2. A method for connecting an electric actuator to a printed circuit by metal contacts according to claim 1, wherein the printed circuit includes drilled through holes configured to allow the electrical connection pins of the actuator through.

3. A method for connecting an electric actuator to a printed circuit by metal contacts according to claim 1, wherein the electrical connection pins of the actuator can be soldered to the printed circuit by soldering.

4. A method for connecting an electric actuator to a printed circuit by metal contacts according to claim 1, wherein the contact zone is curved towards the printed circuit.

5. A method for connecting an electric actuator to a printed circuit by metal contacts according to claim 1, wherein the contact zone is curved away from the printed circuit.

6. A method for connecting an electric actuator to a printed circuit by metal contacts according to claim 1, wherein the electrical connection pins of the actuator include grooves perpendicular to an axis of the electrical connection pins.

7. A method for connecting an electric actuator to a printed circuit by metal contacts according to claim 1, wherein the metal contacts include flat surfaces that contact the printed circuit.

8. A method for connecting an electric actuator to a printed circuit by metal contacts according to claim 1, wherein the metal contacts include convex surfaces that contact the printed circuit.

9. A method for connecting an electric actuator to a printed circuit by metal contacts according to claim 1, wherein the printed circuit includes drill holes configured to allow mechanical guiding and attachment elements belonging to the actuator through.

10. A method for connecting an electric actuator to a printed circuit by metal contacts according to claim 1, wherein the metal contacts are made from steel.

11. A method for connecting an electric actuator to a printed circuit by metal contacts according to claim 1, wherein the metal contacts include a star-shaped contact zone with a plurality of branches.

12. A method for connecting an electric actuator to a printed circuit by metal contacts having an open contact zone, the method comprising:
    soldering the metal contacts to the printed circuit using an SMD-type automated method performed at a high speed and at a high temperature,
    wherein electrical connection pins of the actuator can be mechanically connected to the metal contacts without soldering by butting the contact zone of the metal contacts against the connection pins of the actuator once the connection pins have been inserted through the contact zone, said metal contacts including a cross-shaped contact zone and said electrical connections pins having a square shape,
    wherein the printed circuit has substantially square tinned connection pads, and
    wherein the metal contacts have a substantially square shape, configured to be placed on the pads, and having a side length of between 0.8 times and 1 time a side length of the pad.

* * * * *